United States Patent [19]

Fukuyama

[11] Patent Number: 5,057,683
[45] Date of Patent: Oct. 15, 1991

[54] ERROR PREVENTIVE CIRCUIT FOR A PHOTOELECTRIC SWITCH

[75] Inventor: Toshifumi Fukuyama, Uji, Japan

[73] Assignees: Astex Co., Ltd.; Takenaka Electronic Industrial Co., Ltd., Kyoto, Japan

[21] Appl. No.: 421,611

[22] Filed: Oct. 13, 1989

[30] Foreign Application Priority Data

Oct. 28, 1988 [JP] Japan ............................. 63-273918
Oct. 28, 1988 [JP] Japan ............................. 63-273919

[51] Int. Cl.$^5$ ............................................. H01J 40/14
[52] U.S. Cl. ................................. 250/214 B; 250/221
[58] Field of Search ............... 250/214 B, 214 R, 221, 250/222.1; 307/311

[56] References Cited

U.S. PATENT DOCUMENTS 3,723,738 3/1973 Brenner et al. ..................... 250/221
4,434,363 2/1984 Yorifuji et al. ................. 250/214 B

FOREIGN PATENT DOCUMENTS 56-28049 6/1981 Japan .

Primary Examiner—David C. Nelms
Attorney, Agent, or Firm—Brumbaugh, Graves, Donohue & Raymond

[57] ABSTRACT

An error preventive circuit for a photoelectric switch is formed of a logic circuit, and it is highly responsive, while preventing erroneous operations caused by noises, eliminates the need of capacitors, and is suitable for circuit integration. The circuit validates the incoming light reception pulse only when its base-of-N counter has advanced to N counts, and, if the light reception pulse deviates in time by a certain value in the range of synchronism, a base-of-M counter is preset so that the timing of light reception is re-established at the center of the allowable range of synchronism.

10 Claims, 4 Drawing Sheets

ERROR PREVENTIVE CIRCUIT FOR A PHOTOELECTRIC SWITCH

BACKGROUND OF THE INVENTION (a) Field of the Invention

The present invention relates to a logic circuit for preventing erroneous operations of photoelectric switches, and it is intended to obviate erroneous operations caused by noises, while minimizing the packaging area of the whole circuit. Among the inventive photoelectric switches, which include both of the transmission type and reflection type, the transmission-type photoelectric switch is designed to synchronize the timing signal of the light reception circuit with the pulse signal of the light projector without using wires, and the reflection-type photoelectric switch is designed to prevent mutual interferences with confronting counterparts.

(b) Description of the Prior Art

Most of photoelectric switches operate by detecting a signal of a light emitting diode which is driven by a pulse generation circuit to emit intermittent lights. Contact-type switches create spark noises intermittently at opening and closing their points, and the light receiver of photoelectric switch fails to discriminate these noises from the legitimate signal, resulting often in erroneous operations. In order to prevent such malfunctions, the synchronous detection system is generally adopted. However, this system can merely lower the probability of erroneous operations caused by noises, and it cannot completely prevent a malfunction when a noise coincides with the signal. To cope with this matter, the voltage level as a result of synchronous detection is integrated by an integration circuit which is mainly composed of a capacitor, and the detected signal is validated only when the integrated voltage has reached a certain voltage level. Namely, according to the error preventive system employed widely, the signal detection is not recognized unless signals are received a number of times continuously.

Photoelectric switches are provided in their circuit with a short-circuit protection circuit with the intention of protecting the output transistor from destruction which would occur if the signal line is erroneously short-circuitted to the power line. However, if the output line is extended too long, it picks up noises to activate the short-circuit protection circuit, which erroneously invalidates the output. Use of a photoelectric switch in a noise-rich environment will encounter frequent malfunctions of the short-circuit protection circuit. On this account, in such an environment, the short-circuit protection circuit is provided with a capacitor-based integrating circuit so that the output circuit has a slower response, thereby preventing erroneous operation.

Recently, photoelectric switches have their detection circuit formed mostly of an integrated circuit (IC) so that they are compact, and moreover attempts are being made to incorporate the whole photoelectric switch in a single IC chip inclusive of all necessary circuits. However, if the above-mentioned two integrating circuits for noise prevention use capacitors, each being at least several hundred pF in need, the integrated circuit will require a very large packaging area for these capacitors, which ruins the meaning of the single chip configuration. An alternative configuration of externally connected capacitors causes the IC chip to have increased terminals and thus a greater external dimensions, conflicting with the purpose of circuit integration in pursuit of compactness. In addition, the integrating circuit has a long fall time, creating a time lag of the detection output from the pulse reception, and therefore it does not ensure the high accuracy operation.

Transmittion-type photoelectric switches are installed at separate locations for their light projector and light receiver, and in order to achieve enhanced detection accuracy, the synchronous detection system in which the light projector and receiver operate at a coincident timing must be employed. On this account, the conventional design technique uses a gate circuit in the light receiver and, in addition, lowers the response speed so that a moderate signal-to-noise ratio is retained, at the sacrifice of accuracy due to the lowered response speed. Therefore, innovative means of enhancing the accuracy without dulling the response has been desired.

Use of two reflection-type photoelectric switches confronting each other imposes such an interference problem that one photoelectric switch can malfunction due to the presence of the light projector of the confronting photoelectric switch. Conventionally this problem is obviated by using light projector of different light emission periods in case of a same model, under obligation of readjustment and intricate inventory control for the products.

SUMMARY OF THE INVENTION

It is an object of the present invention to provide an error preventive circuit for photoelectric switches capable of surely elimination erroneous operations caused by noises.

Another object of this invention is to provide a circuit arrangement which does not use any capacitor and is suitable for the fabrication of a single-chip integrated circuit which requires a smaller packaging area.

A further object of this invention is to provide an error preventive circuit for photoelectric switches operative to synchronize the gate operation of the light receiver with a high frequency light emission of the light projector, whereby a transmision-type switch has enhanced reliability and accuracy of synchronous detection, and two confronting reflection-type switches are prevented from mutual interferences effectively.

These and other objects, features and advantages of this invention will become more apparent from the following detailed description taken in conjunction with the accompanying drawings.

BRIEF DESCRIPTION OF THE DRAWINGS

The accompanying drawings illustrate preferred embodiments of the present invention, in which.

DETAILED DESCRIPTION OF THE INVENTION

Preferred embodiments of this invention will be described with reference to the accompanying drawings.

Figure 1:
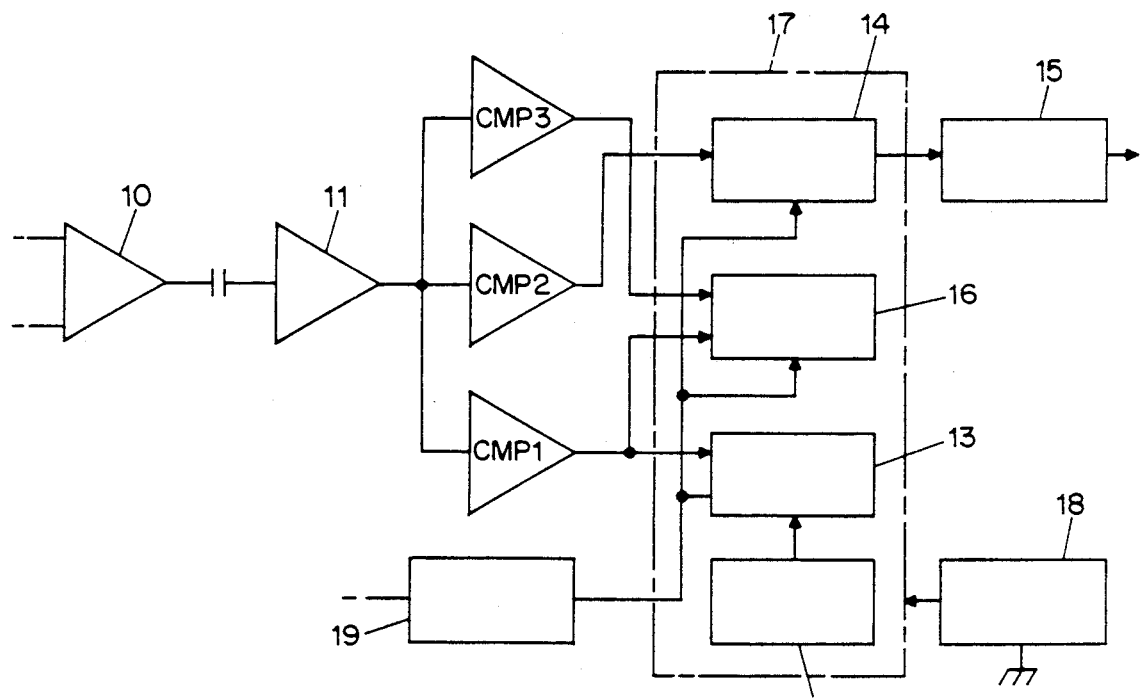
FIG. 1 is a block diagram of the integrated circuit of a photoelectric switch using the inventive circuit arrangement.

FIG. 1 is a block diagram showing the integrated circuit of a photoelectric switch using the inventive circuit arrangement, in which a light pulse from a light projector is received by a light reception circuit 10 which produces a light reception pulse, and it is amplified by an amplifier 11 and then introduced to comparators CMP1 through CMP3. The three comparators have respective reference voltages in a relation of CMP1 < CMP2 < CMP3. Indicated by 12 is an oscillation circuit, and 13 is a digital phase lock loop (PLL) circuit which receives a clock signal for the oscillation circuit 12 and a light reception pulse from the comparator CMP1. Indicated by 14 is a detection circuit which receives a light reception pulse from the comparator CMP2, 15 is an output circuit which receives the output of the detection circuit 14, and 16 is a stability indicator circuit which receives the outputs of the comparators CMP1 and CMP3 and the PLL circuit 13 to indicate the stable output state of the photoelectric switch. The oscillation circuit 12, PLL circuit 13, detection circuit 14 and stability indicator circuit 16 in combination constitute an integrated injection logic (IIL) circuit 17. Indicated by 18 is a parallel constant-voltage circuit for supplying power to the IIL circuit 17. This integrated circuit is intended to form a single-chip photo IC inclusive of a photodiode and have six input/output terminals. Indicated by 19 is a switching circuit for selecting the transmission or reflection mode for the photoelectric switch.

Figure 2:
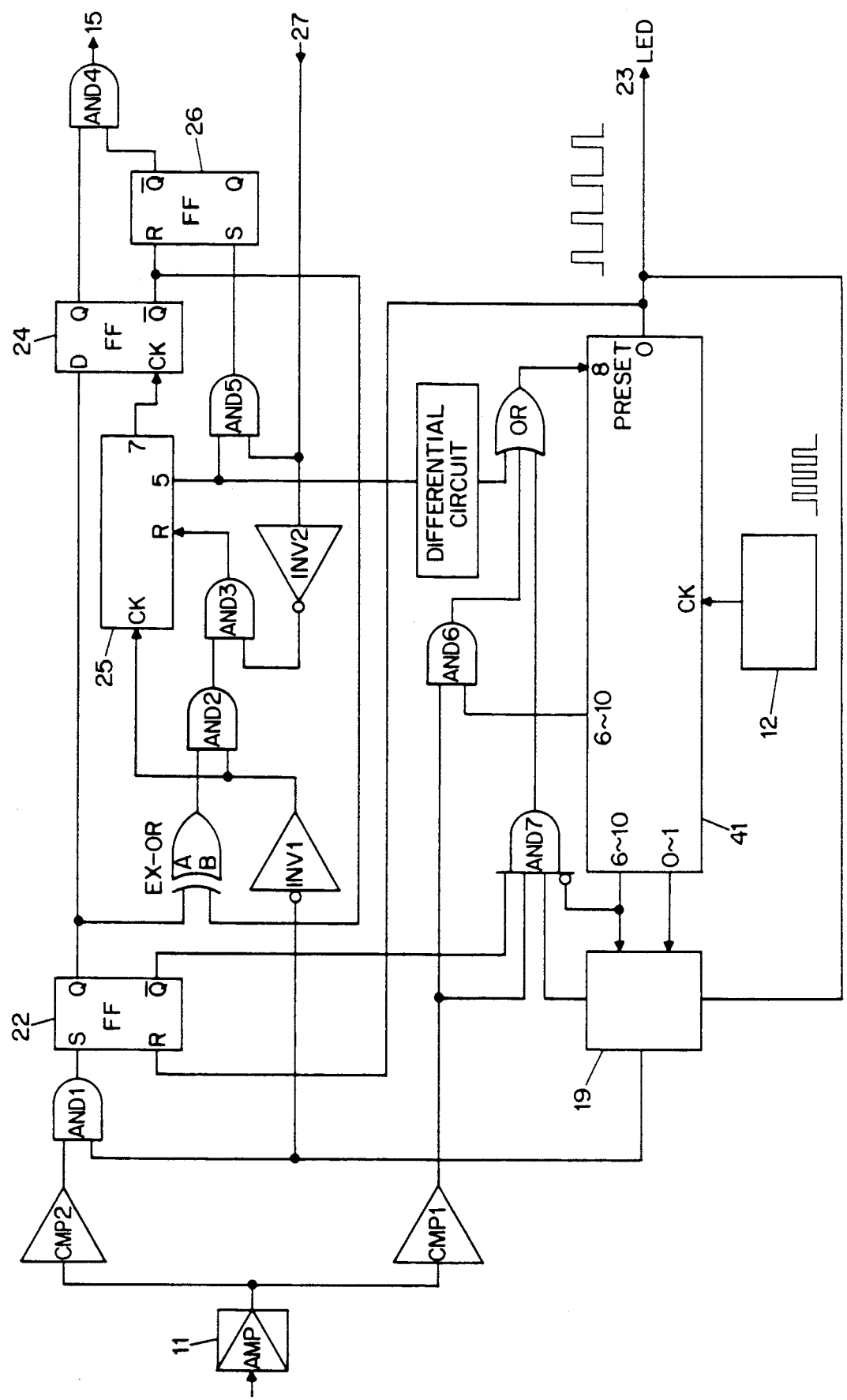
FIG. 2 is a logic circuit diagram showing the entirety of the inventive circuit arrangement.

FIG. 2 shows the entirety of the inventive circuit arrangement, which includes an error prevention function against noises and a function of synchronous detection or interference prevention. The circuit diagram of FIG. 2 can be divided into simple explanatory schematic diagrams one of which is shown in FIG. 4

FIG. 2 shows the detection circuit which includes the inventive error preventive circuit. Indicated by AND1 is an AND gate which fulfills the output condition by receiving the light reception pulse from the comparator CMP2 and the synchronous signal from the PLL circuit shown in detail in FIG. 5, which coincides with digital PLL circuit 13 in FIG. 1, by way of the mode switching circuit 19, 22 is a set-priority RS-type flip-flop which receives a high output from the AND gate AND1 and holds its Q output terminal high and is reset by receiving the light emitting diode (LED) driving output 23 from the PLL circuit. Indicated by 24 is a D-type flip-flop which receives the output signal on the Q output of the RS flip-flop 22 and holds the $\bar{Q}$ output in a certain state in response to the count-up signal (clock signal) of the counter which will be explained shortly. At the start-up of operation, with a high D input, the flip-flop 24 retains a low Q output and a high $\bar{Q}$ output until it receives the next count-up signal. An exclusive-OR gate EX-OR has an A input derived from the Q output of the RS flip-flop and a B input derived from the $\bar{Q}$ output of the D flip-flop 23. An AND gate AND2 fulfills the output condition by receiving the output of the exclusive-OR gate EX-OR and the synchronous signal of the PLL circuit inverted by an inverter INV1, and it provides the output to the reset terminal R of the counter by way of an AND gate AND3. Indicated by 25 is a base-of-N (octal in this embodiment) counter, with its clock terminal CK receiving the signal from the inverter INV1, i.e., the inverted synchronous signal of the PLL circuit. Upon receiving N-1 (seven in this embodiment) consecutive pulses, the counter provides the count-up signal to the clock terminal CK of the D flip-flop 24. Indicated by 26 is an RS flip-flop which retains a high $\bar{Q}$ output except at the entry of a short-circuit signal, which will be exampled shortly, and it opens an AND gate AND4 to pass a high Q output of the D flip-flop 24 to the output circuit 15.

Figure 4:
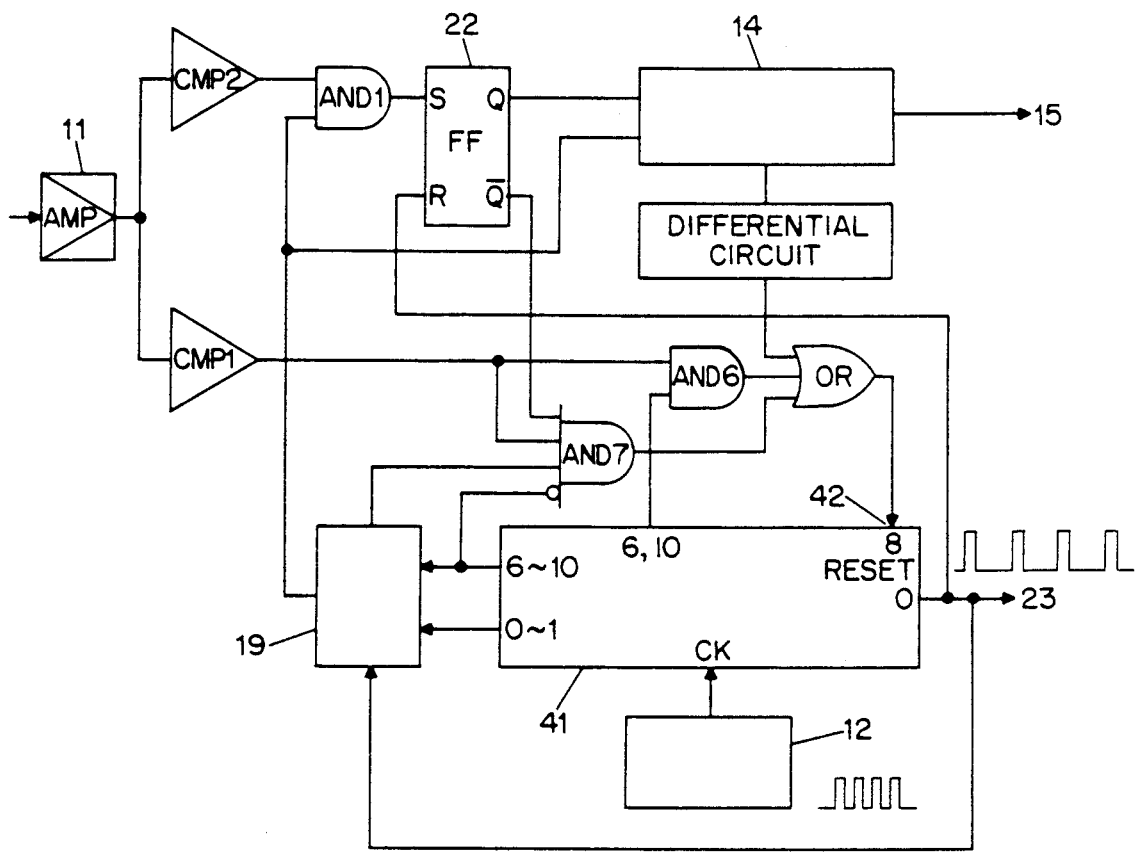
FIG. 4 is a logic circuit diagram showing the arrangement for the synchronous detection or interference prevention.

FIG. 4 is a timing chart showing the signal levels at principal portions of the circuit described on FIG. 2. A waveform 31 is the LED drive voltage (1/16 duty cycle) used for activating the LED and also resetting the RS flip-flop 22. A waveform 32 is the light reception pulse which is generated by a light sensitive element in response to an LED light emission, amplified by the amplifier 11 and shaped by the comparator CMP1. A waveform 33 is the synchronous signal, which also serves at its falling edge to clock the counter 25. A waveform 34 is the Q output of the RS flip-flop 22, and it retains a high level during the cycle in response to the output 32 until it is reset by the rising edge of the next LED drive signal 31. The signal goes high again and retains the high level in response to a successive light reception pulse 32. A waveform 35 is the output of the exclusive-OR gate EX-OR, 36 is the output of the AND3 for clearing the counter 25, 37 in the count-up signal used to clock the D flip-flop 24, 38 in the Q output of the D flip-flop 24, and 39 in the $\bar{Q}$ output of the D flip-flop 24 which is initialized to have a low Q output and a high $\bar{Q}$ output.

Figure 3:
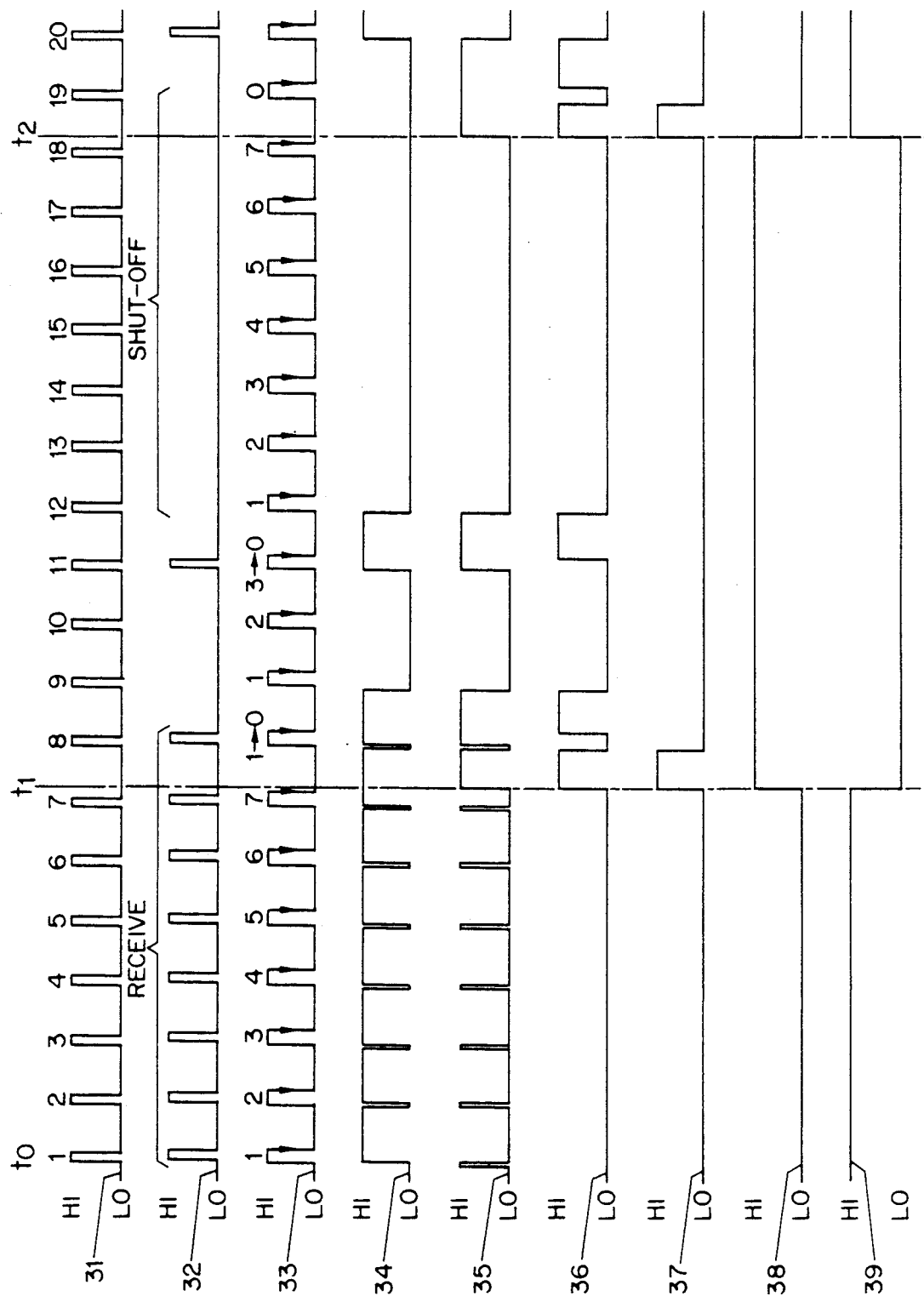
FIG. 3 is a timing chart showing principal outputs of the circuit shown in FIG. 2.

Next, the operation of the circuit shown in FIG. 2 will be explained. When the light reception pulse 32 and synchronous signal 33 arise coincidently, the AND gate AND1 fulfills the output condition, providing its high output to the set terminal S of the RS flip-flop 22, which then delivers a high Q output. Since the light reception pulse is fed through the amplifier 11 and other elements, it has a time lag. On this account, the flip-flop 22 is reset momentarily by the LED driving output 31 to have a reversed output. However, the RS flip-flop 22 is a set-priority type, and therefore even if it is reset by the LED driving output 31, the arriving light reception pulse sets the flip-flop dominantly, and the high Q output is retained. The RS flip-flop 22 has its high Q output 34 delivered to the A input of the exclusive-OR gate EX-OR and also to the D input of the D flip-flop 24. The D flip-flop 24 has its $\bar{Q}$ output fed to the B input of the exclusive-OR gate EX-OR, and when it is high, the exclusive-OR gate EX-OR functions as an inverter for the A input, and accordingly the signals 34 and 35 are in the opposite phase relation during a period from t0 to t1 on the timing chart of FIG. 3. Consequently, the AND2 retains a low output and the counter 25 is not reset so far as the light reception pulse 31 has a proper interval.

The counter 25 receives through the inverter INV1 a clock input which is an inverted version of the synchronous signal 33, and it up-counts in response to the falling edge of the signal 33. After the counter 25 has received seven consecutive count pulses (clock signal), it produces a count-up signal 37, which causes the D flip-flop 24 to latch the D input at its rising edge. At this point (t1), the signal coincides with the output 34 of the RS flip-flop 22. Namely, the RS flip-flop 22 has a high Q output, causing the D flip-flop 24 to hold a high Q output, which is delivered to one input of the AND gate AND4. At the same time, the $\overline{Q}$ output of the D flip-flop 24 turns from high to low, and the B input of the exclusive-OR gate EX-OR becomes low. The exclusive-OR gate EX-OR now functions as a buffer, and its output 35 is coincident with the Q output of the RS flip-flop 22 during a period from t1 to t2. Namely, after time point t1, the exclusive-OR gate EX-OR and inverter INV1 have both high output, causing the AND gate AND2 to fulfill the output condition, and its high output is fed to the AND gate AND3. The AND3 has another input kept high normally, and its output operates on the counter 25 at the reset terminal R to clear the count value to zero. In this manner, the condition of object detection is established only after seven light reception pulses have been received continuously.

When the eighth pulse arrives, the counter 25 is going to up-count to one, but the opened AND gate AND2 sends the reset signal, causing the counter 25 to restore a zero-count.

The following explains the case in which the ninth and tenth light reception pulses ar absent due to the presence of an object. The exclusive-OR gate EX-OR receives low A and B inputs, producing a low output 35, which closes the AND2 from resetting the counter 25. Then, the counter 25 proceeds counting. But when the "11"th light reception pulse arrives, the AND gate AND2 is opened to reset the counter 25 to zero. Accordingly, after the input signal has been validated by being seven or more consecutive pulse input, the count-up signal is not delivered to the clock terminal CK of the D flip-flop 24 even if two or three input pulses are missing, and the signal to the output circuit 15 remains high.

The period from the "12"th to "18"th pulses stands for the missing of seven consecutive light reception pulses, accordingly not noises but the state of light-off. During the period, the exclusive-OR gate EX-OR has a low A and B input, retaining its low output, and therefore the counter 25 is not reset. Accordingly, the counter 25 up counts the clock signal supplied through the inverter INV1, and when the count has reached "7", it provides a count-up signal to the clock terminal CK of the D flip-flop 24. At this point (t2), the D flip-flop 24 has a low D input, and it reverses the Q output from high to low. Then, the $\overline{Q}$ output goes high, causing the exclusive-OR gate EX-OR to fulfill the output condition with a low A and high B inputs, and it delivers a high output to the reset terminal R of the counter 25 by way of the AND gates AND2 and AND3, and the counter 25 is cleared to zero. At this point (t2), i.e., after the "19"th pulse, no detected signal is sent to the output circuit 15 unless there arrive again seven light reception pulses consecutively. Namely, once it is judged that the output signal subsides following the absence of seven consecutive light reception pulses, no count-up signal is delivered to the clock terminal CK of the D flip-flop 24 even if there arrives a few false light reception pulses caused by noises or the like. Unless the input signal is validated, the output to the output circuit 15 is blocked, and the input signal is validated only upon receiving seven consecutive light reception pulses.

Electrical noises are mostly intermittent noises created by sparks of contact switches or the like, and the arrival of seven consecutive noise pulses is conceivably negligible, and therefore the D flip-flop 24 does not turn the Q output in response to noises. Accordingly, erroneous operations caused by noises can surely be prevented. The N value of the counter period, which differs depending on the total amplification of the circuit and the shield condition, is preferably in the range from 4 to 10 in general. A large N value can reduce the probability of erroneous operations due to noises, but at the sacrifice of a degraded response speed in the normal state, while a smaller N value enhances the response speed, but at risk of higher error rate. Therefore the N value is determined on a compromise basis between these conditions.

Next, the error preventive function for the short-circuit protection circuit, which is another feature of the circuit arrangement shown in FIG. 2, will be described. If a short-circuit is detected on the part of the output transistor, it is indicated as a high-level short-circuit signal 27 to the inverter INV2. The signal inverted to a low-level by the INV2 closes the AND gate AND3 from clearing the counter 25, which then starts counting. The counter 25 has a "count 5" output, which is taken "AND" with the "high" short-circuit signal by AND gate AND5. The AND gate AND5 delivers and active high output to the set input of the RS flip-flop 26, which produces a low $\overline{Q}$ output to close the following AND gate AND4. Consequently, the detected signal to the output circuit 15 is cut-off, and output transistor is protected from destruction that would otherwise occur is the short-circuit condition is not removed.

A burst of noise can last for a few pulse counts period at most, as mentioned previously, and it does not cause the counter 25 to produce the "count 5" signal and the AND gate AND5 to fulfill the output condition. Based on the inference that the counter 25 reaches "5" due to a short-circuit instead of noises, the destruction of output transistor is obviated. Once a short-circuit on the output transistor is recognized, the detected signal is blocked by the RS flip-flop 26, and because the flip-flop 26 has its reset terminal R connected to receive the $\overline{Q}$ output of the D flip-flop 24, if the power to the photoelectric switch is removed, the RS flip-flop 26 is also reset. However, if the short-circuit on the output transistor remains unsolved at a subsequent output, the short-circuit protection circuit operates again to protect the output circuit 15.

Figure 5:
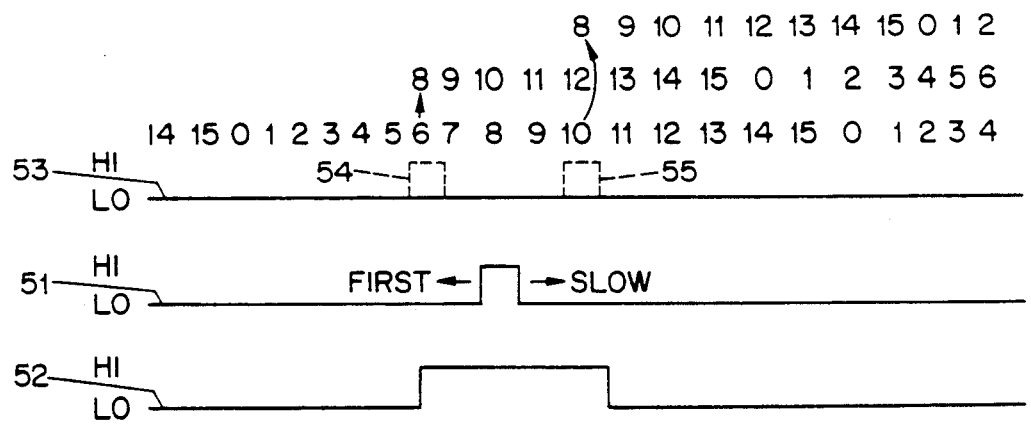
FIG. 5 is a timing chart showing the operation of the circuit shown in FIG. 4 as a transmission-type photoelectric switch.

FIG. 5 shows the circuit arrangement for synchronous detection or interference prevention according to this invention. This circuit section coincides with the digital PLL circuit 13 in FIG. 1. A pulse oscillation circuit 12 has its oscillator formed of a ring oscillator made up of an odd number of inverters in serial connection. The oscillator basis the oscillation period on the total time lag of inverters, and does not necessitate a capacitor, which contribute to a smaller packaging area when the circuit is integrated. A significant result from the adoption of the IIL circuit, as in this invention, is a variable oscillation period through the adjustment of the injection source.

Indicated by 41 is a base-of-M (hexadecimal in this embodiment) counter which produces count outputs at counts 0 and 1 for the synchronous signal used in reflection mode, at counts 6 through 10 for the synchronous signal used in transmission mode, at counts 6 and 10 for the heading and ending timing signals used in transmission mode, and at count 0 for the LED drive signal and reset signal of the RS flip-flop 22. The counter 41 has a preset function which alters any count value to "8", which is a middle value of the synchronous signal of transmission mode, in response to the input on the preset terminal 42. An AND gate AND6 is opened on receiving the pulse output of the comparator CMP1 and the timing signal of count 6 or 10 procided by the counter 41, and it delivers the output through an OR gate to the preset terminal 42 of the counter 41. Since the comparators CMP1 and CMP2 have their reference voltages set in a CMP1<CMP2 relation, the RS flip-flop 22 has a high $\overline{Q}$ output in the absence of the light reception signal, and it reverses the output on receiving a light reception signal. An AND gate AND1 is opened by receiving the output of the transmission/reflection mode switching circuit 19 and the output of the comparator CMP2. An AND gate AND7 is opened by receiving the $\overline{Q}$ output of the RS flip-flop 22, the output of the comparator CMP1, and the inverted synchronous signal for transmission mode from the hexadecimal counter 41, and it provides an output to the OR gate at the arrival of a light reception signal during periods other than counts 6 through 10 of synchronous signal. Indicated by 14 is a detection circuit which is a principal portion of FIG. 3, and it operates in unison with the AND gate AND1 and RS flip-flop 22.

The following describes the operation of the inventive circuit used in transmission mode with reference to the timing chart of FIG. 5. The light projector and light receiver are set to have a virtually equal period for light emission and LED drive output 23 respectively. After a light emission by the light projector has been received by the light receiver, the comparator CMP1 sends a light reception signal to the AND gate AND6. In this case, when the light reception pulse 51 produced by the comparator CMP1 is in-phase with count-8 of the counter 4, the light receiver captures the transmitted signal accurately without problem. Actually, however, these devices are merely set to operate with a virtually same period, and their periods are not exactly equal since they have no electrical connection. Therefore, if the light projector has a shorter period relative to that of the light receiver, for example, the light reception pulse will move to the left progressively, as shown in FIG. 5, and these signals can only coincide at an interval determined from the least common multiple of the periods unless some correcting means is devised. In the inventive circuit arrangement, the AND gate AND1 has its one gate kept open during a period from count 6 to count 10 of the transmission mode synchronous signal (shown by 52), and when the counter output 53 comes close to the heading value "6" of the transmission mode synchronous signal (shown by 54) as it deviates progressively from the center value, the AND gate AND6 is opened by receiving the count-6 timing signal provided by the counter 41 so that it delivers an active output to the preset terminal 42 of the counter 41 by way of the OR gate. The counter 41 is reset to have its output 53 revised from "6" to "8" that is the center value of the transmission mode synchronous signal, resulting in a remaining time length up to the cycle end reduced by a 2-pulse period from 16 to 14-pulse period, and thus the period of the light receiver is shortened. The next cycle for the light reception pulse starts at the center value "8". In this manner, if the light projector has a shorter period than that of the light receiver, the count value of the latter is corrected to "8" upon reception at count "6", and the light receiver is pulled back in-phase with the light emission period of the light projector.

On the other hand, if the light projector has a longer period than that of the light receiver, the light reception pulse moves to the right as shown in FIG. 5, and it deviates continuously unless some correcting means is devised. In the inventive circuit arrangement, when the counter output 53 has reached "10" that is the ending value of the transmission mode synchronous signal (shown by 55), the AND gate AND6 is opened by receiving the count-10 timing signal provided by the counter 41, and the output is delivered to the preset terminal of the counter 41 by way of the OR gate. The counter is reset to have its count output 53 revised from "10" to "8", resulting in a remaining time length increased by 2-pulse period to 18-pulse period, and thus the period of the light receiver is expanded. The next cycle for the light reception pulse starts at the center value "8". In this manner, if the light projector has a longer period than that of the light receiver, the count value of the latter is corrected from "10" to "8", and the light receiver is pulled back in-phase with the light emission period of the light projector.

In case the light receiving period and light input differ more than ±2/16 cycle (2-pulse) period, resulting in the arrival of the light reception signal before count 6 or after count 10, the circuit does not accept the input, and any false input from extraneous light or noise sources having periods outside this range can surely be rejected.

Accordingly, when the light receiver is fairly in phase with the light projector, the light reception pulse arrives in the range from count 6 to count 10, and synchronous detection takes place only during this period. Namely, counts 6 through 10 of the transmission mode synchronous signal is fed through the transmission/reflection switching circuit 19 to the AND gate AND1, which passes the signal from the comparator CMP2 only during the period between counts 6 and 10 for synchronous detection. Consequently, the probability of erroneous operation attributable to noises is reduced significantly. The arrangement enables the synchronous detection without relying on any electrical connection between the light projector and light receiver, and it overcomes the drawback of conventional transmission-type photoelectric switches that are susceptible to noises inherently because of their inability of synchronous detection.

Figure 6:
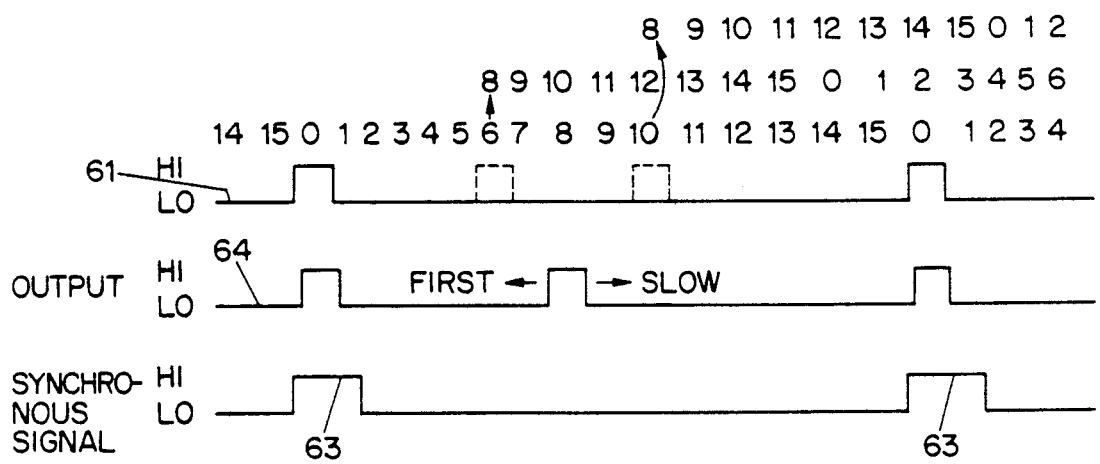
FIG. 6 is a timing chart showing the operation of the circuit shown in FIG. 4 as a reflection-type photoelectric switch.

In case the light projector and light receiver have exactly the same or virtually same period, if the first light reception pulse is happen to be outside the range of counts 6-10 for the AND gate AND1, successive light reception signals cannot enter the detection circuit and the photoelectric switch does not operate. This situation is overcome, in the inventive arrangement, by processing the output of the comparator CMP2 at the detection timing of the comparator CMP1 so that the AND gate AND7 is opened. Namely, the AND gate AND7 has an output timing other than counts 6-10 of the counter 41. At this time, the AND gate AND1 is closed, causing the RS flip-flop 22 to provide a high $\overline{Q}$ output, which opens the AND7 to deliver a high output to the preset terminal 42 of the counter 41 by way of the OR gate, thereby forcing the counter to have a count output "8". Consequently, successive light reception pulses are surely captured within the range of counts 6-10, and the synchronous detecting operation takes place as described above, Since the above-mentioned operation of AND gate AND7 is needed only once at the beginning, the $\overline{Q}$ terminal of the RS flip-flop 22 is connected to the AND gate AND7, so that once a synchronized output is produced, a high output of the AND gate AND1 sets the RS flip-flop 22 to have a low $\overline{Q}$ output, thereby closing the AND gate AND7. After that, a synchronous state continues and the AND gate AND7 will not be opened The inventive circuit can also be used as a reflection-type photoelectric switch by switching the transmission/reflection mode switching circuit. In this case, as shown in the timing chart of FIG. 6, the LED is activated at count 0 (shown by 61), which will produce a light reception pulse at a point between counts 0–1 of the reflection mode synchronous signal if an object to be detected is present, and the AND gate AND1 is opened to cover the period of counts 0–1 (shown by 63), and the stable object detection free from noise-caused erroneous operations can be accomplished.

When the reflection mode is selected, the transmission/reflection mode switching circuit 19 provides a low output, thereby preventing the AND gate AND7 from activation.

Furthermore, the inventive circuit arrangement is capable of preventing the mutual interference of reflection-type photoelectric switches having the same light emitting period disposed to confront each other. Namely, a light reception pulse 64 from other photoelectric switch which is isolated electrically is dealt with in the same manner as the case of transmission mode and is always captured in the period between counts 6–10. Therefore, it does not coincide with the gate timing of the AND gate AND1, and it can be definitely distinguished from its own signal in the period between counts 0–1. Accordingly, light projectors of the same model and type can be used without a risk of erroneous operation.

What is claimed is:

1. An error preventive circuit for a photoelectric switch which operates in either transmission mode or reflection mode, whichever is selected, to detect an object by processing a light reception pulse by means of a plurality of comparators, wherein said circuit comprises: a base-of-N counter which is clocked by a synchronous signal for the light reception pulse detection, a flip-flop which receives an in-phase light reception pulse as a set input and a drive signal for a light projector as a reset input, a means of latching the Q output of said flip-flop in response to a periodic signal provided by said counter and producing a detection output signal, an exclusive-OR gate which receives the Q output of said flip-flop and an inverted output of said latch means, and an AND gate (AND2) arranged to produce, in response to the output of said exclusive-OR gate and an inverted version of the synchronous signal, a high-level output, by which said counter is cleared.

2. An error preventive circuit for a photoelectric switch according to claim 1 further comprising a short circuit protection circuit which includes a first AND gate (AND5) arranged to produce a high-level output, in response to a specific value of said counter and a short-circuit signal which is created by the occurrence of a short-circuit on an output transistor or the like connected to the detection output signal of said switch; a means of inverting the output of said AND gate (AND5); and an second AND gate (AND4) arranged to block the detection output signal, in response to the output of the inverting means, said short-circuit protection circuit operating to invalidate the detection output signal if the short-signal lasts until said counter reaches said specific value.

3. An error preventive circuit for a photoelectric switch according to claim 1, wherein said latch means comprises a D-type flip-flop.

4. An error preventive circuit for a photoelectric switch according to claim 1, wherein said counter comprises an octal counter.

5. An error preventive circuit for a photoelectric switch according to claim 1, wherein the timing of said synchronous signal for entering a detection input is dependent on the selected mode of transmission or reflection.

6. An error preventive circuit for a photoelectric switch which operates in either transmission mode or reflection mode, whichever is selected, to detect an object by processing a light reception pulse by means of a plurality of comparators, said circuit comprising:

an oscillation circuit for generating a clock signal;

a base-of-M counter having a synchronous signal output with a certain duration for detecting a light reception pulse, outputs for a heading timing signal and a ending timing signal used in transmission mode and a preset input for presetting said counter to have a count value between the values of said heading and ending timing signals when the entry of the light reception pulse is coincident with the value of said heading timing signal or said ending timing signal; and an AND gate (AND6) arranged to produce a high-level output which is connected to the preset input of said counter, in response to a light reception pulse and heading and ending timing signals.

7. An error preventive circuit for a photoelectric switch according to claim 6, wherein the timing of said synchronous signal for entering a detection input is dependent on the selected mode of transmission or reflection.

8. An error preventive circuit for a photoelectric switch according to claim 6, additionally comprising a second AND gate (AND 7), arranged to produce a high-level output which is connected to the preset input of said counter, in response to an inverted transmission mode synchronous signal and a signal indicating said light reception pulse is outside the range of the value of said heading timing signal to the value of said ending timing signal.

9. An error preventive circuit for a photoelectric switch according to claim 6, wherein said oscillation circuit comprises a ring oscillator which includes an odd number of inverters in serial connection.

10. An error preventive circuit for a photoelectric switch according to claim 6, wherein said counter comprises a hexadecimal counter.

* * * * *